United States Patent
Hartman et al.

(10) Patent No.: US 10,028,403 B1
(45) Date of Patent: Jul. 17, 2018

(54) FLOATING CIRCUIT BOARD CONNECTOR SYSTEM

(71) Applicant: Dell Products L.P., Round Rock, TX (US)

(72) Inventors: Corey Dean Hartman, Hutto, TX (US); Salvador D. Jimenez, III, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/593,076

(22) Filed: May 11, 2017

(51) Int. Cl.
  *H05K 7/14* (2006.01)
  *H01R 12/73* (2011.01)
  *H01R 43/26* (2006.01)
  *H01R 12/70* (2011.01)

(52) U.S. Cl.
  CPC ....... *H05K 7/1452* (2013.01); *H01R 12/7005* (2013.01); *H01R 12/73* (2013.01); *H01R 43/26* (2013.01)

(58) Field of Classification Search
  CPC .... H01R 12/73; H01R 43/26; H01R 12/7005; H05K 7/1452
  USPC .......................................................... 439/64
  See application file for complete search history.

(56) References Cited

U.S. PATENT DOCUMENTS

| | | | | |
|---|---|---|---|---|
| 5,911,050 A * | 6/1999 | Egan | ................... | G06F 13/4068 361/58 |
| 6,247,937 B1 * | 6/2001 | Miwa | ................... | H05K 1/117 439/59 |
| 6,299,455 B1 * | 10/2001 | Dong | ................... | H01R 12/716 439/541.5 |
| 6,386,909 B1 * | 5/2002 | Hsia | ................... | H01R 23/6873 439/541.5 |
| 6,540,523 B1 * | 4/2003 | Kung | ................... | H01R 13/2442 439/541.5 |
| 6,568,957 B1 * | 5/2003 | Lu | ................... | G06K 7/0082 439/541.5 |
| 6,666,724 B1 * | 12/2003 | Lwee | ................... | G06K 7/0043 439/138 |
| 6,687,134 B2 * | 2/2004 | Vinson | ................... | G06F 1/184 211/41.17 |
| 6,885,565 B2 * | 4/2005 | Shi | ................... | G06F 1/184 361/732 |
| 7,101,222 B2 * | 9/2006 | Ho | ................... | H01R 27/02 439/541.5 |
| 7,278,872 B2 * | 10/2007 | Brown | ................... | G06F 1/185 361/801 |
| 7,787,258 B2 * | 8/2010 | Cheney | ................... | H05K 7/1431 312/223.2 |

(Continued)

*Primary Examiner* — Alexander Gilman
(74) *Attorney, Agent, or Firm* — Haynes and Boone, LLP

(57) ABSTRACT

A board assembly includes a first board. The first board includes a first board connector that is configured to connect to a first baseboard connector receptacle included on a baseboard and a first board component coupled to the first board connector through the first board. The board assembly also includes a second board that is movably coupled to the first board by at least one floating coupling that allows the second board to move relative to the first board. The second board includes a second board connector that is configured to connect to a second baseboard connector receptacle included on the baseboard and a second board component coupled to the second board connector through the second board.

20 Claims, 16 Drawing Sheets

(56) References Cited

U.S. PATENT DOCUMENTS

| | | | | |
|---|---|---|---|---|
| 7,938,687 | B2* | 5/2011 | Zhu | H01R 12/721 439/631 |
| 8,553,424 | B2* | 10/2013 | Chiang | H05K 7/1408 361/759 |
| 2001/0029127 | A1* | 10/2001 | Higuchi | G06K 7/0021 439/541.5 |
| 2004/0023553 | A1* | 2/2004 | Lee | H01R 12/716 439/541.5 |
| 2004/0092159 | A1* | 5/2004 | Tsai | G06K 7/0021 439/541.5 |
| 2009/0191763 | A1* | 7/2009 | Zhu | H01R 12/716 439/632 |
| 2010/0279528 | A1* | 11/2010 | Zhu | H01R 12/721 439/152 |
| 2011/0059654 | A1* | 3/2011 | Zhu | H01R 12/707 439/630 |
| 2011/0189895 | A1* | 8/2011 | Ito | H01R 24/38 439/629 |
| 2013/0309893 | A1* | 11/2013 | Li | H01R 13/64 439/328 |
| 2013/0316585 | A1* | 11/2013 | McGrath | H01R 13/6471 439/630 |
| 2015/0126050 | A1* | 5/2015 | Ma | H01R 12/716 439/83 |

* cited by examiner

US 10,028,403 B1

FLOATING CIRCUIT BOARD CONNECTOR SYSTEM

BACKGROUND

The present disclosure relates generally to information handling systems, and more particularly to a floating circuit board connector system for an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices, storage devices, and/or other computing devices often include circuit boards with connectors (e.g., edge connectors) that allow those circuit boards to be connected to other circuit boards and/or devices. For example, many computing devices include a motherboard having one or more sockets that may connect to matching connectors on riser board(s) (e.g., PCI riser card(s)). As the input/output density of computing devices increases, the bandwidth per riser board requires an increasing density of pins per connector and an increasing quantity of connectors per riser board. However, as the number of connectors and pins per connector increases, the pin pitch of connector pins on the connectors decreases, and tolerances relating to the amount of lateral movement and lateral misalignment allowable between multiple connectors of the riser board and multiple sockets of the motherboard decreases.

Conventional manufacturing techniques typically provide motherboards with a certain amount of tolerance in the relative location of the sockets. When the tolerance of the relative location between multiple sockets on the motherboard exceeds the lateral movement tolerance of corresponding connectors on a riser board used with that motherboard, issues can arise. For example, the riser board connectors can bind with out-of-tolerance sockets of the motherboard, socket housings and/or connector pins can be damaged, and/or the pins of the riser board may miss their corresponding pads included in the socket (or short circuit in response to connecting to adjacent pads.) As the pin pitch of connector pins decreases to sub-millimeter distances, these issues are exacerbated, resulting in increased manufacturing costs due to an increase in out-of-tolerance spacing of sockets, and the need to purchase elaborate tooling to achieve more accurate spacing.

Accordingly, it would be desirable to provide an improved circuit board connector system.

SUMMARY

According to one embodiment, an Information Handling System (IHS) includes a chassis; a first board connector receptacle located in the chassis; a second board connector receptacle located in the chassis, wherein the first board connector receptacle and the second board connector receptacle substantially share a common longitudinal axis; and a board assembly; wherein the board assembly includes a first board having a first board connector configured to be coupled with the first board connector receptacle; and a second board that is movably coupled to the first board by at least one floating coupling that allows the first board to move relative to the second board, wherein the second board includes a second board connector configured to be coupled with the second board connector receptacle.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
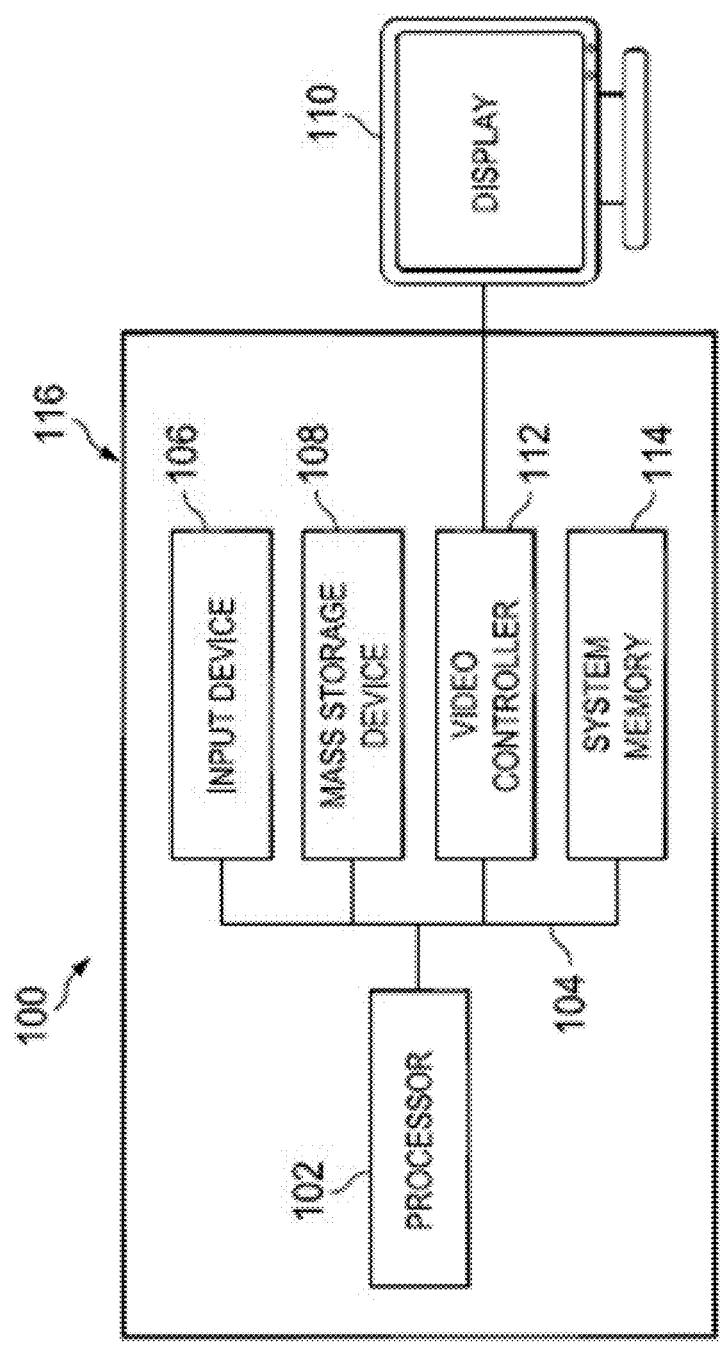
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
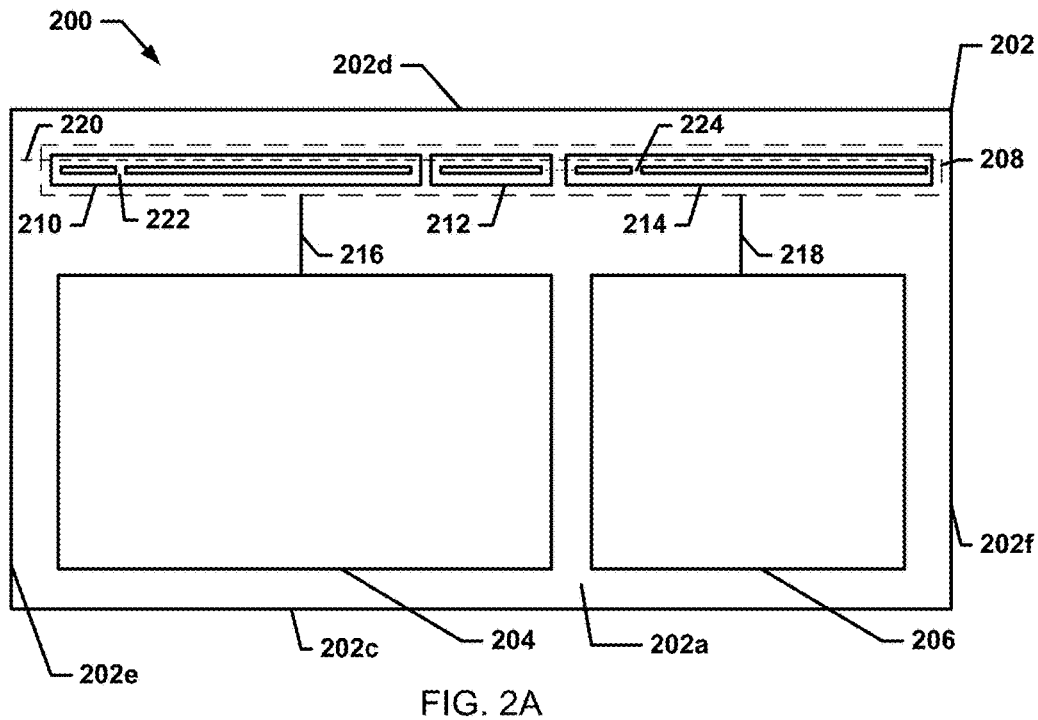
FIG. 2A is a top view illustrating an embodiment of a baseboard.
Figure 2B:
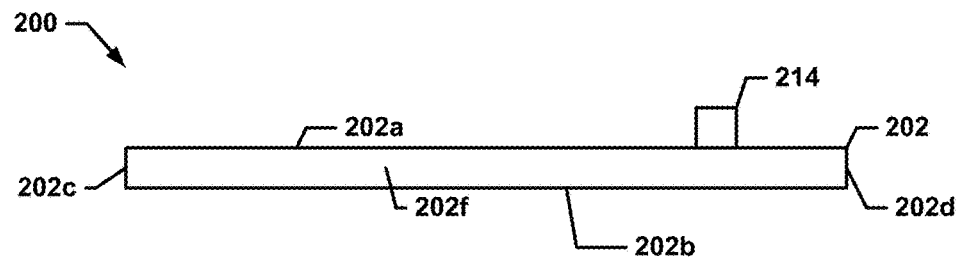
FIG. 2B is a side view illustrating an embodiment of the baseboard of FIG. 2A.
Figure 2C:
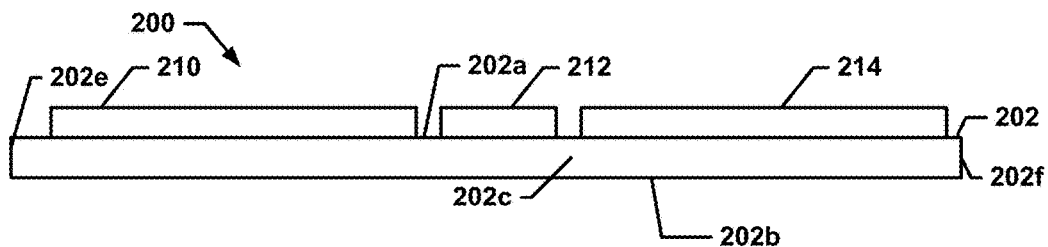
FIG. 2C is a front view illustrating an embodiment of the baseboard of FIG. 2A.
Figure 3A:
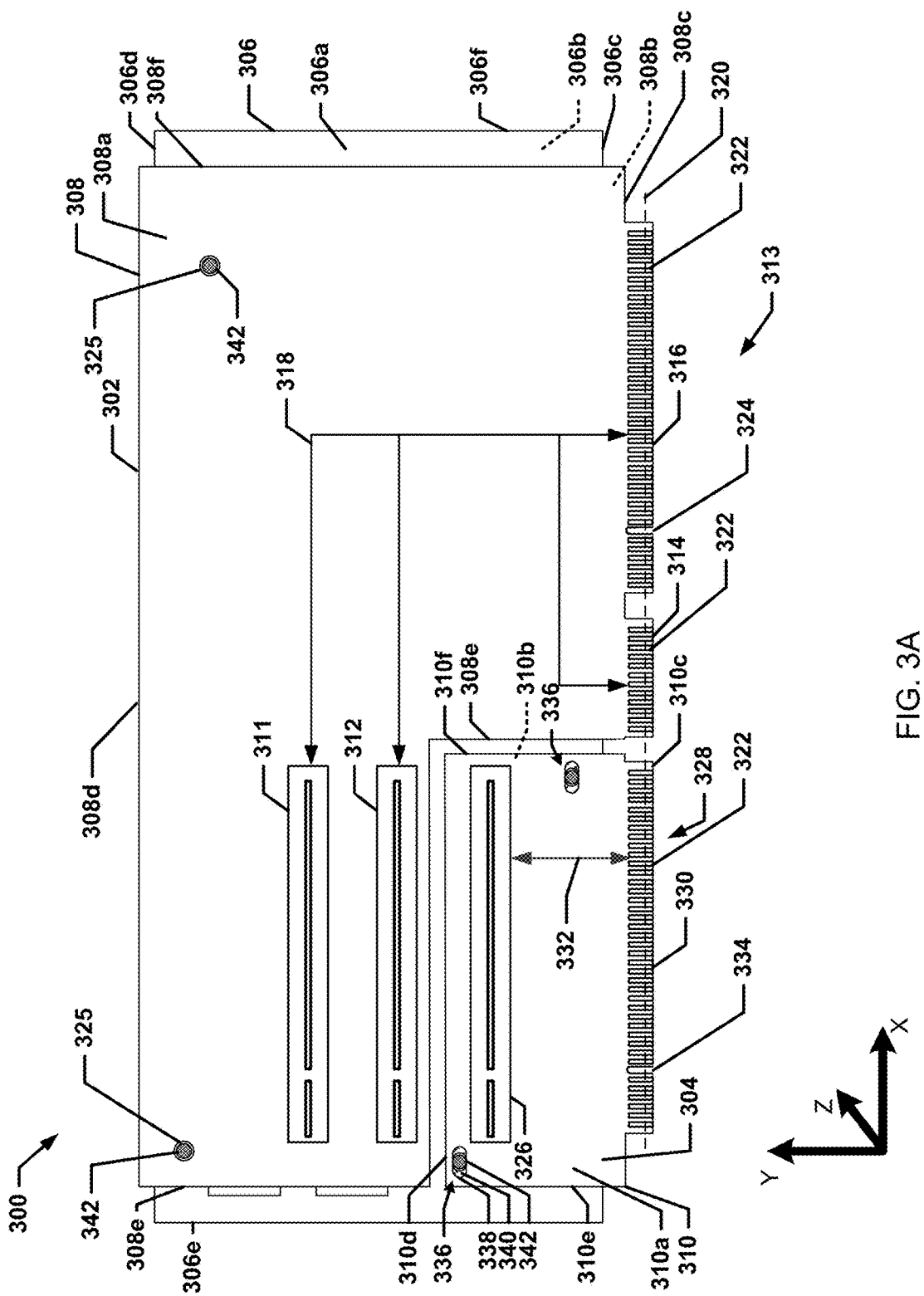
FIG. 3A is a top view illustrating an embodiment of a board assembly.
Figure 3B:
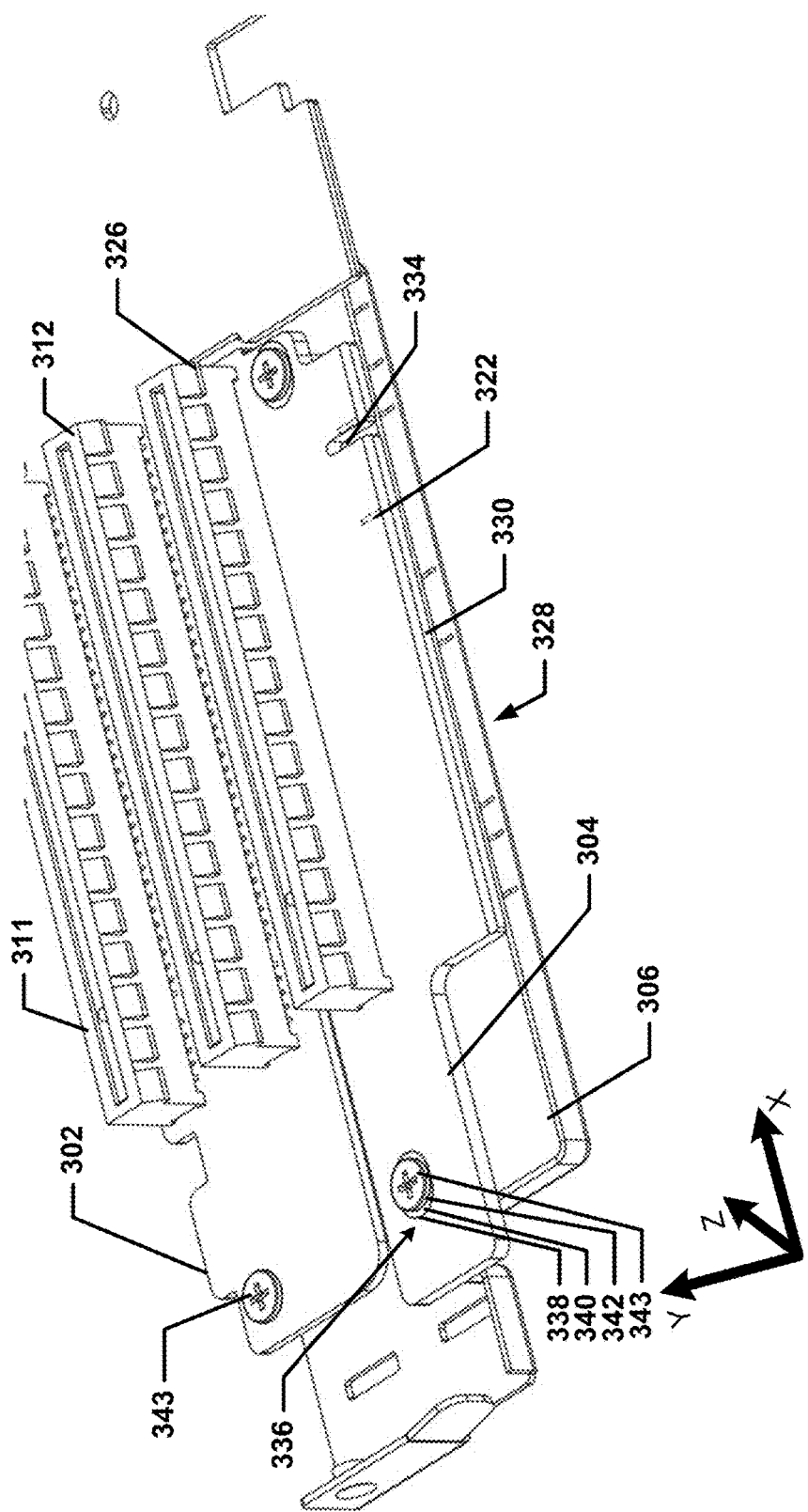
FIG. 3B is an exploded, isometric view illustrating an embodiment of the board assembly of FIG. 3A.
Figure 3C:
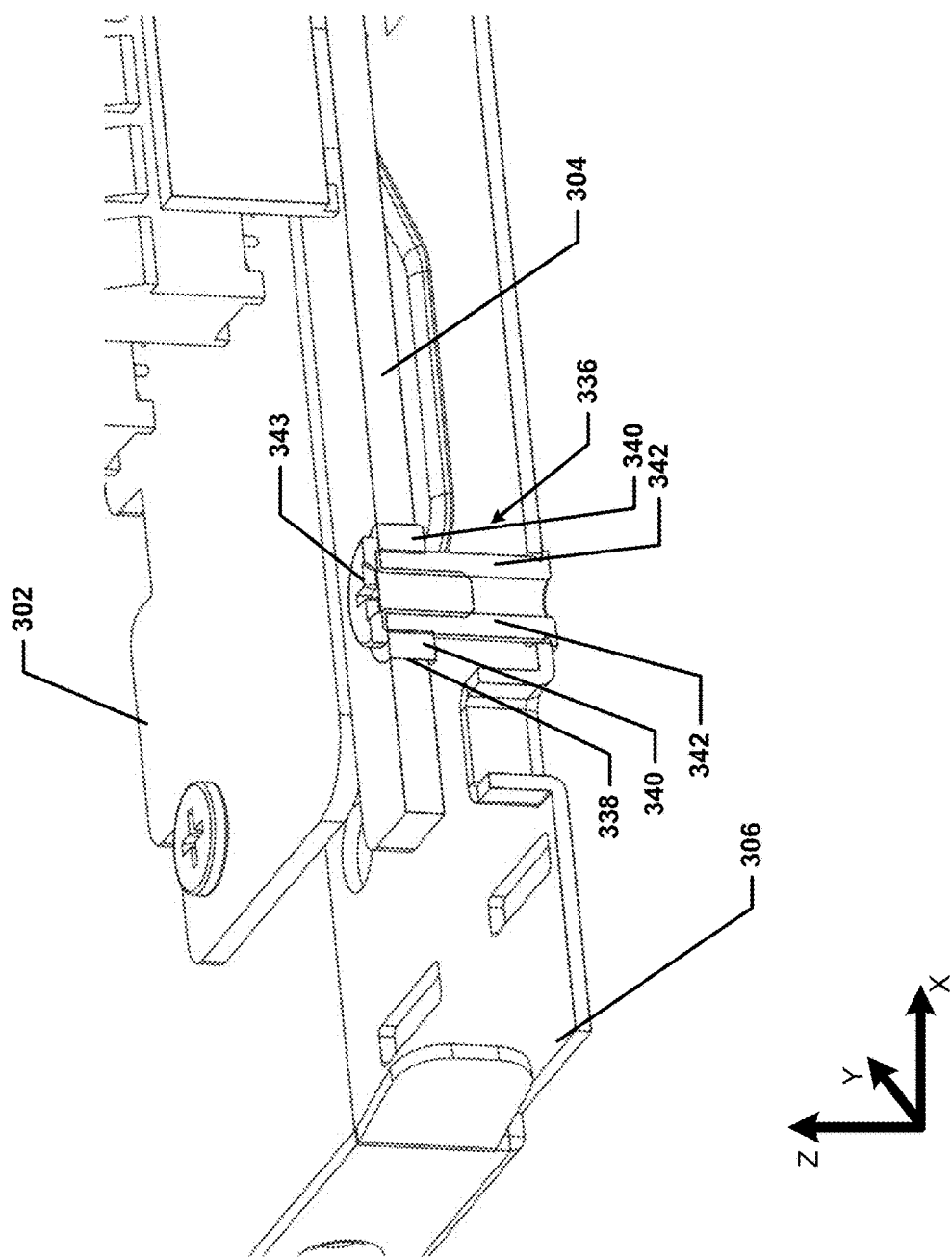
FIG. 3C is an exploded, cutaway, isometric view illustrating an embodiment of the board assembly of FIG. 3A.
Figure 3D:
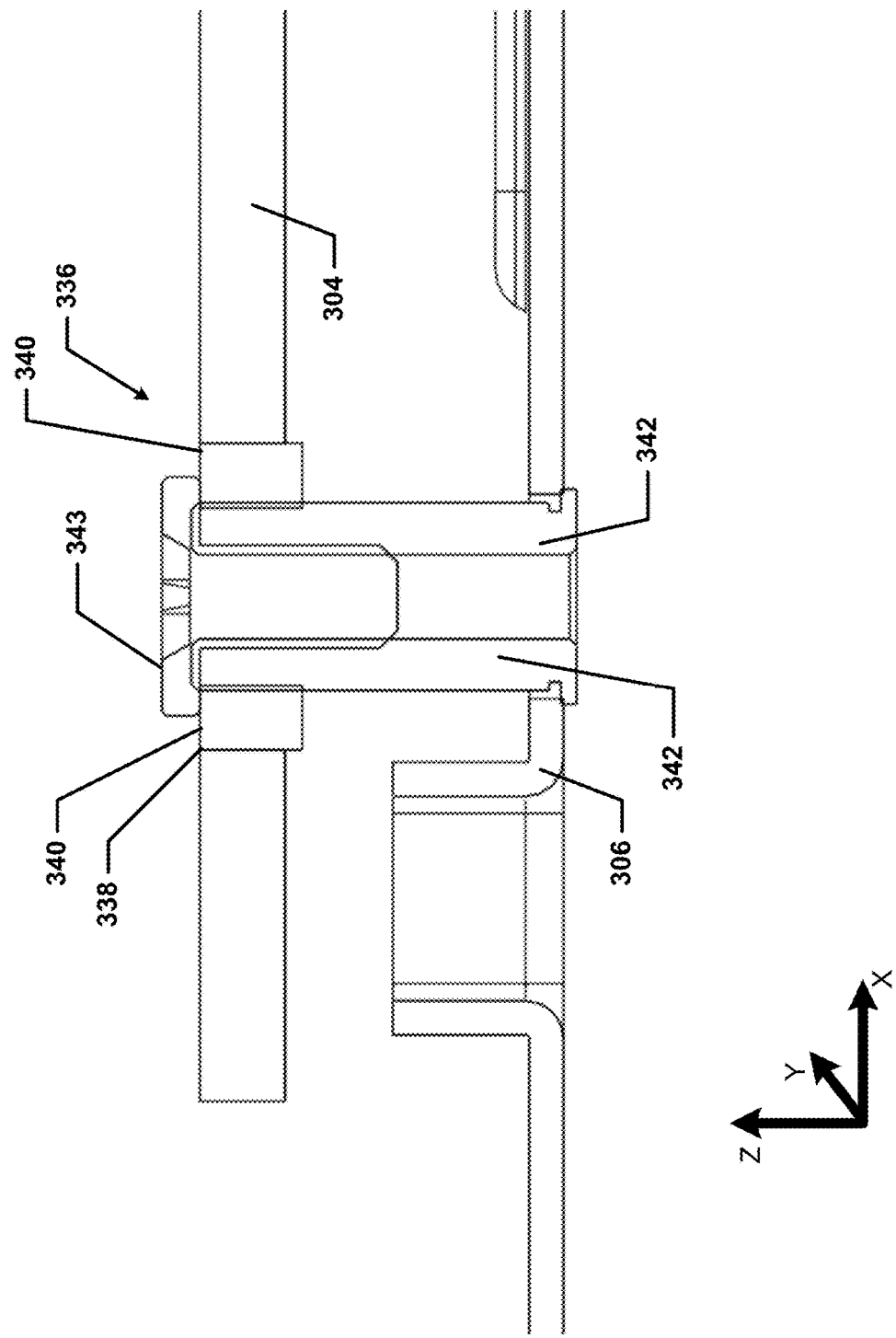
FIG. 3D is an exploded, cutaway, side view along a front edge of the board assembly of FIG. 3A.
Figure 3E:
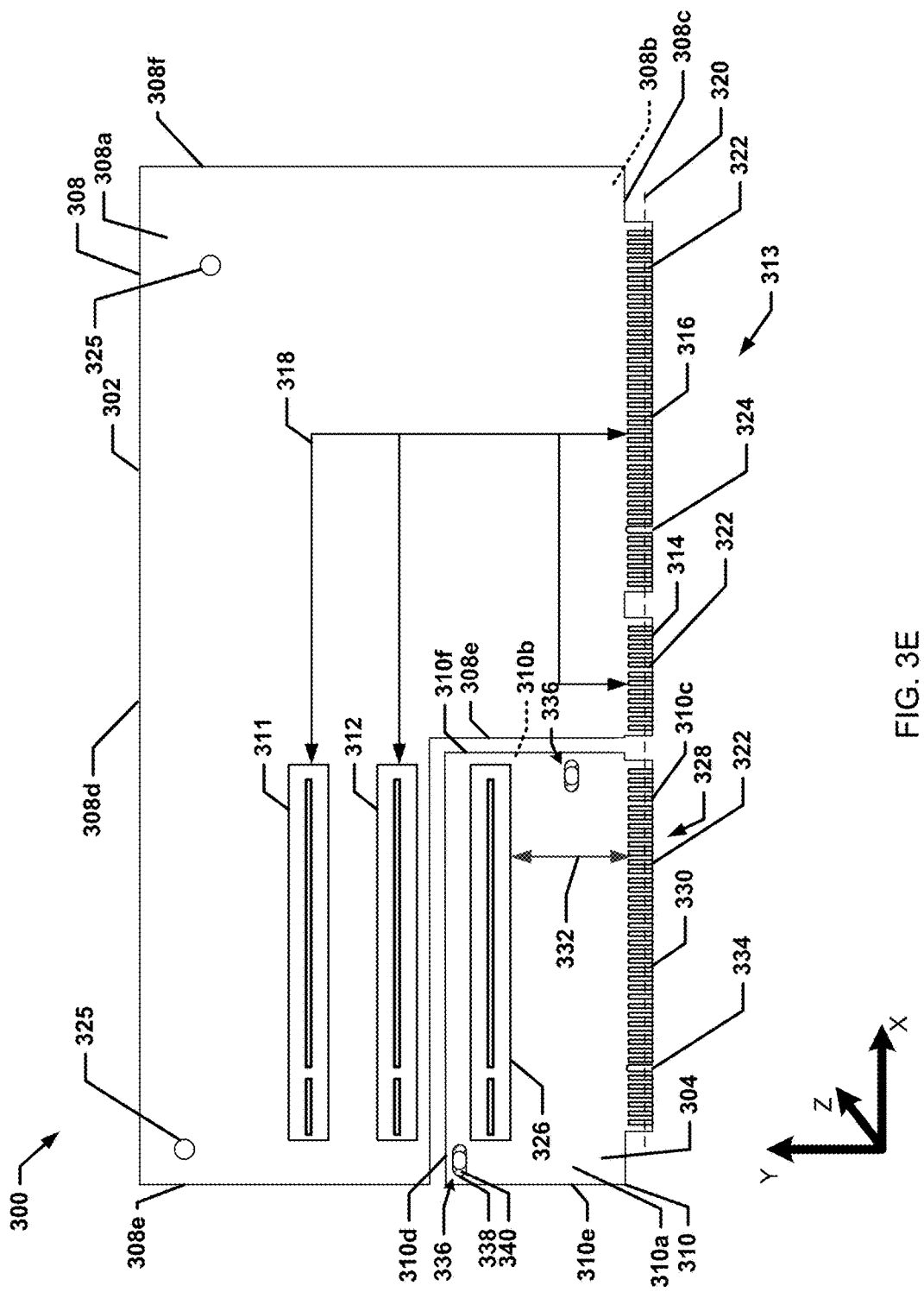
FIG. 3E is a top view illustrating an embodiment of a first board and a second board of the board assembly of FIG. 3A.
Figure 3F:
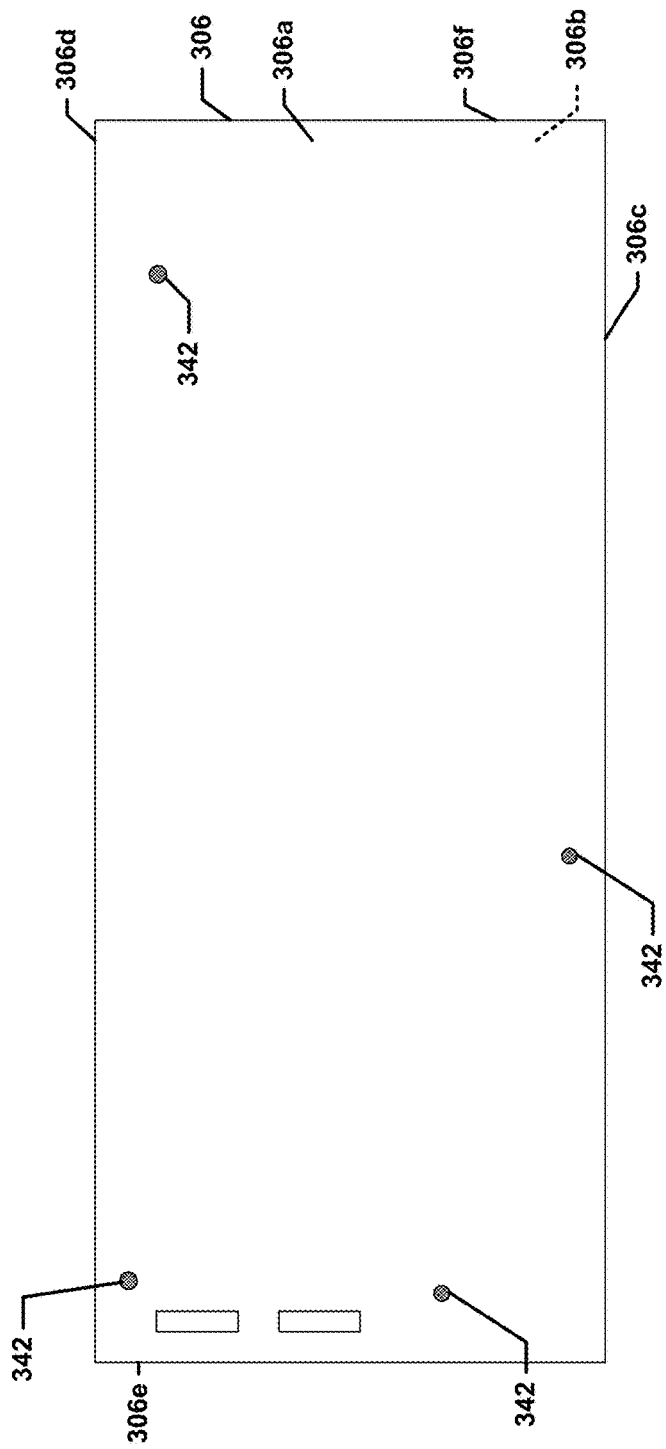
FIG. 3F is a top view illustrating an embodiment of a mounting structure of the board assembly of FIG. 3A.

Referring now to FIGS. 2A, 2B, and 2C, an embodiment of a baseboard 200 is illustrated. In an embodiment, the baseboard 200 may be provided in an IHS 100, described above with reference to FIG. 1, such that the baseboard 200 includes and/or is electrically coupled to the processor 102, described above with reference to FIG. 1. In a specific embodiment, the baseboard 200 is provided by a motherboard, although other types of boards are envisioned as falling within the scope of the present disclosure. The baseboard 200 includes a baseboard base 202 having a top surface 202a, a bottom surface 202b that is located opposite the baseboard base 202 from the top surface 202a, a front edge 202c extending between the top surface 202a and the bottom surface 202b, a rear edge 202d located opposite the baseboard base 202 from the front edge 202c and extending between the top surface 202a and the bottom surface 202b, and a pair of side edges 202e and 202f that are located opposite each other on the baseboard base 202 and that each extend between the top surface 202a, the bottom surface 202b, the front edge 202c, and the rear edge 202d. One or more baseboard components, such as, for example, a first baseboard component 204 and a second baseboard component 206, may be located on the top surface 202a of the baseboard base 202. The first baseboard component 204 and the second baseboard component 206 may include a variety of electrical and/or mechanical components that may be provided on the baseboard 200 such as a processor socket for a processor, memory devices, a memory slot for a memory card, a basic input output system (BIOS), various types of controllers, a heat sink, a video card slot, power connectors, a northbridge, a southbridge, and/or other board components that would be apparent to one of skill in the art in possession of the present disclosure.

A baseboard connector receptacle system 208 may be included on the top surface 202a of the baseboard base 202. The baseboard connector receptacle system 208 may include a plurality of baseboard connector receptacles such as a first baseboard connector receptacle 210, a second baseboard connector receptacle 212, and a third baseboard connector receptacle 214. The baseboard connector receptacles 210-214 may be coupled to the baseboard components 204 and/or 206 by one or more communication buses such as, for example, a first communication bus 216 and/or a second communication bus 218. In a specific embodiment, the baseboard connector receptacle system 208 may be board/card slots configured to receive edge connectors of a single board/card with multiple edge connectors. For example, the baseboard connector receptacles 210-214 may be configured to receive one or more connectors of a riser board and may include a Peripheral Component Interconnect (PCI) slot, a PCI express (PCIe) slot, an Industry Standard Architecture (ISA) slot, an Accelerated Graphics Port (AGP) slot, a Video Electronics Standard Association (VESA) slot, an Extended ISA (EISA) slot, a Communication and Network Riser (CNR) slot, an Audio/Modem Riser (AMR), memory slots (e.g., a Single In-line Memory Module (SIMM) slot, Dual In-line Memory Module (DIMM) slots, etc.) and/or other connector receptacles apparent to one of skill in the art may benefit from the teachings of the present disclosure and thus are envisioned as falling within its scope. While three baseboard connector receptacles 210-214 are illustrated in the baseboard connector receptacle system 208, the baseboard connector receptacle system 208 may include only two connector receptacles (e.g., baseboard connector receptacles 210 and 212), or may include more than three baseboard connector receptacles, and still benefit from the teachings of the present disclosure. Furthermore, while baseboard connector receptacle system 208 includes a plurality of connector receptacles (i.e., female connectors), one of skill in the art in possession of the present disclosure will recognize that the baseboard connector receptacle system 208 may be replaced by a connector system that includes a plurality of connectors (i.e., male connectors), or a connector system that includes both connector receptacles and connectors, while still falling within the scope of the present disclosure.

As illustrated, the first baseboard connector receptacle 210, the second baseboard connector receptacle 212, and the third baseboard connector receptacle 214 may be included in a first row of the baseboard connector receptacle system 208. As such, the baseboard connector receptacles 210-214 may be considered to be in an "aligned baseboard connector receptacle orientation" that includes a first common longitudinal connector receptacle axis 220 that is substantially co-linear with riser card slots defined by each of the baseboard connector receptacles 210-214. However, it is contemplated that any of baseboard connector receptacles 210-214 may be staggered or otherwise offset such that they do not share the common longitudinal connector receptacle axis 220 as illustrated in FIG. 2A.

In an embodiment, each baseboard connector receptacles 210-214 may include a plurality of electrical contacts (not illustrated) that are configured to mate with pins included on a board. The electrical contacts may have a pitch that is less than 3 mm, less than 2 mm, less than 1 mm, less than 0.8 mm, less than 0.5 mm, and/or other distance that would be apparent to one of skill in the art in possession of the present disclosure. In an embodiment, one or more of the baseboard connector receptacles 210-214 may include a connector receptacle key such as a first connector receptacle key 222 included on the first baseboard connector receptacle 210 and a second connector receptacle key 224 included on the third baseboard connector receptacle 214. The connector receptacle keys 222 and 224 may be included to allow compatible boards to couple with the baseboard connector receptacles 210-214 while preventing incompatible boards from coupling with the baseboard connector receptacles 210-214.

Referring now to FIGS. 3A, 3B, 3C, 3D, 3E, and 3F, an embodiment of a board assembly 300 is illustrated. In an embodiment, the board assembly 300 may include a first board 302, a second board 304, and a mounting structure 306. In a specific embodiment, the first board 302 and the second board 304 may be riser cards configured to couple with another board such as the baseboard 200 of FIG. 2. Specifically, the first board 302 and the second board 304 may be configured to couple to the baseboard connector receptacle system 208 of the baseboard 200 (which, as discussed below, may also be configured to mate with a single board having multiple connectors.) The first board 302 includes a first board base 308 having a top surface 308a, a bottom surface 308b (hidden in this view) that is located opposite the first board base 308 from the top surface 308a, a front edge 308c extending between the top surface 308a and the bottom surface 308b, a rear edge 308d located opposite the first board base 308 from the front edge 308c and extending between the top surface 308a and the bottom surface 308b, and a pair of side edges 308e and 308f that are located opposite each other on the first board base 308 and that each extend between the top surface 308a, the bottom surface 308b, the front edge 308c, and the rear edge 308d.

One or more first board components such as, for example, a first board component 311 and a second board component 312 may be located on the top surface 308a of the first board base 308. The first board component 311 and the second board component 312 may include a variety of electrical and/or mechanical components that may be provided on the first board 302 such as one or more connector receptacles (e.g., a memory card slot, a PCI card slot), various types of controllers, power connectors, processor connectors, heat sinks, and/or other board components that would be apparent to one of skill in the art in possession of the present disclosure. In the illustrated embodiment of the first board 302, the first board component 311 and the second board component 312 may include PCI/PCIe card slots.

A first board connector system 313 may be included on the front edge 308c of the first board base 308. The first board connector system 313 may include at least one board connector such as a first board connector 314 and a second board connector 316. The board connectors 314-316 of the first board 302 may be coupled to the board components 311 and/or 312 via a first communication bus 318. In a specific embodiment, the board connectors 314-316 may include edge connectors configured to couple with baseboard connector receptacles 210-214. In the specific illustrated example, the board connectors 314-316 may be configured to couple with the second baseboard connector receptacle 212 and the third baseboard connector receptacle 214. As such, the board connectors 314-316 may include a PCI connector, a PCIe connector, an ISA connector, an AGP connector, a VESA connector, an EISA slot, a CNR connector, an AMR connector, memory connector (e.g., a SIMM connector, DIMM connector, etc.) and/or other connectors apparent to one of skill in the art that may benefit from the teachings of the present disclosure and thus envisioned as falling within its scope. While two board connectors 314 and 316 of the first board 302 are illustrated in the first board connector system 313, the first board connector system 313 may include only a single board connector (e.g., the first board connector 314), or may include more than two board connectors, and still benefit from the teachings of the present disclosure. Furthermore, while first board connector system 313 includes at least one connector (i.e., male connector), one of skill in the art in possession of the present disclosure will recognize that the first board connector system 313 may be replaced by a connector receptacle system that includes at least one connector receptacle (i.e., at least one female connector), or a connector system that includes both connector receptacles and connectors, while still falling within the scope of the present disclosure.

In the illustrated embodiment, the first board connector 314a and the second board connector 316 may be included in a row of the first board connector system 313. As such, the board connectors 314 and 316 may be considered to be in an "aligned board connector orientation" that includes a first common longitudinal connector axis 320 that is substantially co-linear with the first board connector 314a and the second board connector 316. However, it is contemplated that any of board connectors 314 and 316 may be staggered or otherwise offset such that they do not share the common longitudinal connector axis 320.

In an embodiment, each board connector 314 and 316 may include a plurality of electrical contacts 322 (e.g., pins) that are configured to mate with the electrical contacts included on the baseboard 200. The plurality of electrical contacts 322 may be on the top surface 308a and/or the bottom surface 308b of the first board base 308 and extend to the front edge 308c. The electrical contacts 322 may have a pitch that is less than 3 mm, less than 2 mm, less than 1 mm, less than 0.8 mm, less than 0.5 mm, and/or other distance that would be apparent to one of skill in the art in possession of the present disclosure. In addition, one or more of board connectors 314 and 316 may include a keying element such as a keying element 324 included on the second board connector 316. The keying element 324 may be included to allow the first board 302 to couple with a compatible baseboard connector receptacle, while preventing the first board 302 from being coupled with an incompatible baseboard connector receptacle. In the illustrated embodiment, the keying element 324 may be an aperture extending into the first board base 308 from the front edge 308c and extending through the first board base 308 from the top surface 308a to the bottom surface 308b In an embodiment, the first board base 308 may include at least one coupling element 325 that may be configured to couple the first board 302 to the board assembly 300. In the illustrated embodiment, the coupling element 325 may be an aperture defined by the first board base 308 and extending from the top surface 308a through the first board base 308 to the bottom surface 308b. However, in various embodiments, the coupling element 325 may include a floating coupling similar to the floating coupling 336 described further below.

In an embodiment, the board assembly 300 includes the second board 304 that includes a second board base 310 having a top surface 310a, a bottom surface 310b (hidden in this view) that is located opposite the second board base 310 from the top surface 310a, a front edge 310c extending between the top surface 310a and the bottom surface 310b, a rear edge 310d located opposite the second board base 310 from the front edge 310c and extending between the top surface 310a and the bottom surface 310b, and a pair of side edges 310e and 310f that are located opposite each other on the second board base 310 and that each extend between the top surface 310a, the bottom surface 310b, the front edge 310c, and the rear edge 310d.

One or more second board components such as, for example, a third board component 326 may be located on the top surface 310a of the second board base 310. The third board component 326 may include a variety of electrical and/or mechanical components that may be provided on the second board 304 such as one or more connector receptacles (e.g., a memory card slot, a PCI card slot), various types of controllers, power connectors, processor connectors, heat sinks, and/or other board components that would be apparent to one of skill in the art in possession of the present disclosure. In the illustrated embodiment of the second board 304 in FIG. 3A-3D, the third board component 326 may include a PCI/PCIe card slot.

A second board connector system 328 may be included on the front edge 310c of the second board base 310. The second board connector system 328 may include at least one board connector such as a third board connector 330. The third board connector 330 of the second board 304 may be coupled to the third board components 326 via a communication bus 332. In a specific embodiment, the third board connector 330 may include an edge connector configured to couple with baseboard connector receptacles 210-214. In the specific illustrated example, the third board connector 330 may be configured to couple with the first baseboard connector receptacle 210. The third board connector 330 may be configured to insert into one or more connector receptacles of a motherboard and may include a PCI connector, a PCIe connector, an ISA connector, an AGP connector, a VESA connector, an EISA slot, a CNR connector, an AMR connector, memory connector (e.g., a SIMM connector, DIMM connector, etc.) and/or other connectors apparent to one of skill in the art that may benefit from the teachings of the present disclosure and thus are envisioned as falling within its scope. While one board connector 330 is illustrated in the second board connector system 328, the second board connector system 328 may include a plurality of board connectors and still benefit from the teachings of the present disclosure. Furthermore, while second board connector system 328 includes at least one connector (i.e., male connector), one of skill in the art in possession of the present disclosure will recognize that the second board connector system 328 may be replaced by a connector receptacle system that includes at least one connector receptacles (i.e., female connectors), or a connector system that includes both connector receptacles and connectors, while still falling within the scope of the present disclosure.

In an embodiment, the third board connector 330 may include a plurality of electrical contacts 322 (e.g., pins) that are configured to mate with the electrical contacts included on the baseboard 200. The plurality of electrical contacts 322 may be on the top surface 310a and/or the bottom surface 310b of the second board base 310 and extend to the front edge 310c. The electrical contacts 322 may have a pitch that is less than 3 mm, less than 2 mm, less than 1 mm, less than 0.8 mm, less than 0.5 mm, and/or other distances that would be apparent to one of skill in the art in possession of the present disclosure. While the plurality of electrical contacts 322 on the third board connector 330 are illustrated as being the same as the electrical contacts 322 on the first board connector 314 and the second board connector 316, one skilled in the art in possession of the present disclosure will recognize that the electrical contacts 322 on the third board connector 330 may be different from each other and/or different from the electrical contacts 322 on the first board connector 314 and the second board connector 316 and still remain within the scope of the disclosure.

In an embodiment, the third board connector 330 may include a keying element as a keying element 334. The keying element 334 may be included to allow the second board 304 to couple with a compatible baseboard connector receptacle, while preventing the second board 304 from being coupled with an incompatible baseboard connector receptacle. In the illustrated embodiment, the keying element 334 may be an aperture extending into the second board base 310 from the front edge 310c and extending through the second board base 310 from the top surface 310a to the bottom surface 310b.

In an embodiment, the second board base 310 may include at least one floating coupling 336 that may be configured to couple the second board 304 to the board assembly 300. For example, the floating coupling 336 may be a slot 338 defined by the second board base 310. The slot 338 may extend from the top surface 310a and through the second board base 310 to the bottom surface 310b to form a slotted hole (e.g., an elongated hole or channel through the second board base.) The floating coupling 336 may also include at least one resilient member 340 that may be provided in the slot 338 and that is configured to receive and engage a coupling member (discussed below) that is coupled to the first board 302 and/or the mounting structure 306. As discussed below, the combination of the coupling member and slot 338 may be configured to allow movement of the second board 304 relative to the first board 302, while the resilient member 340 may be configured to secure the coupling member in the slot 338 and/or resist movement of the second board 304 relative to the first board 302 (while still allowing that movement.) For example, the resilient member 340 may be a material and/or device that includes a spring constant such that, when a force is applied to the resilient member 340, the resilient member 340 stretches or compresses (based on the direction of the force) and returns to equilibrium when the force is removed. In a specific example, the resilient member 340 may be a foam or elastomer element that fills a portion of the slot 338 and/or a spring element such that the slot 338 may still receive the coupling member discussed below.

In an embodiment, the board assembly 300 includes the mounting structure 306 having a top surface 306a, a bottom surface 306b (hidden in this view) that is located opposite the mounting structure 306 from the top surface 306a, a front edge 306c extending between the top surface 306a and the bottom surface 306b, a rear edge 306d located opposite the mounting structure 306 from the front edge 306c and extending between the top surface 306a and the bottom surface 306b, and a pair of side edges 306e and 306f that are located opposite each other on the mounting structure 306 and that each extend between the top surface 306a, the bottom surface 306b, the front edge 306c, and the rear edge 306d.

The mounting structure 306 may include at least one coupling member 342 located on its top surface 306a. In an embodiment, the coupling member 342 may be configured to engage the floating coupling 336 to couple the second board 304 to the mounting structure 306. Furthermore, the coupling member 342 and the floating coupling 336 may be configured such that, when engaged, the second board 304 is coupled to the mounting structure 306 by the floating coupling 336 while being allowed to move relative to the mounting structure 306 along the x-axis and having its movement substantially restricted relative to the mounting structure 306 along the y-axis. In the illustrated embodiment, the coupling member 342 may include a mounting stud that extends from the top surface 306a of the mounting structure 306. The coupling member 342 may include a cap 343 that may couple to the mounting stud such that when the coupling member 342 is engaged with the floating coupling, the coupling member 342 secures the second board 304 to the mounting structure 306. For example, the mounting stud may be a threaded stud and the cap 343 may be a threaded screw or threaded nut that couples to the threaded stud and contacts the top surface 308a of the second board 304 securing the second board 304 from moving along the z-axis and the y-axis. While the coupling member 342 is illustrated as being included on the mounting structure 306 and the floating coupling 336 included on the second board 304, one skilled in the art will recognize that the floating coupling 336 may be included on the mounting structure 306 and/or the second board 304, and the coupling member 342 may be included on the mounting structure 306 and/or the second board 304, and still remain within the scope of the present disclosure. In an embodiment, the coupling member 342 may be configured to engage the coupling element 325 of the first board 302 such that when the coupling member 342 is engaged with the coupling element 325, the first board 302 is secured to the mounting structure 306 such that the first board 302 does not substantially move relative to the mounting structure 306 along the x-axis, y-axis, and z-axis. For example, the coupling member 342 may include the cap 343 to secure the first board 302 to the mounting structure 306. However, as discussed above, the first board 302 may include a floating coupling (similar to the floating coupling 336) to allow the first board 302 to move relative to the mounting structure 306 along the x-axis. In various embodiments, the board assembly 300 may not include the mounting structure 306, and rather the first board 302 and the second board 304 may couple together using floating coupling(s) included on one of the boards 302 or 304 and coupling members included on the other board.

In an embodiment, the mounting structure 306 may include a first board connector and a second board connector (not illustrated) that are in communication with each other such that the first board 302 may couple to the first board connector and the second board 304 can couple to the second board connector. The first board connector and the second board connector of the base may be coupled together by a bus (not illustrated) that provides a path for electrical communications between the first board 302 and the second board 304 in the board assembly 300 and/or provide a common ground path.

In an embodiment, when the floating coupling 336 on the second board 304 is engaged with the coupling member 342 of the mounting structure 306 and the coupling element 325 of the first board 302 is engaged with a coupling member 342, the first board 302 and the second board 304 may be in an "aligned board orientation" such that the first board connector system 313 and the second board connector system 328 are in an "aligned board connector orientation" that includes the common longitudinal connector axis 320 that is substantially co-linear with the first board connector 314, the second board connector 316, and the third board connector 330. However, it is contemplated that any of board connectors systems 313 and 328 may be staggered or otherwise offset such that they do not share the common longitudinal connector axis 320. Furthermore, the first board 302 and second board 304 may be configured such that, when coupled to the mounting structure 306, the side edge 310f of the second board base 310 and the side edge 308e of the first board base 308 may be adjacent each other and spaced apart such that the distance between the side edge 310f and the side edge 308e is at least the maximum distance that the resilient member 340 allows the second board 304 to move in the slot 338 of the floating coupling 336. Furthermore, a first portion of the side edge 308e may extend from first board base 308 such that a portion of the front edge 308c is adjacent the rear edge 310d of the second board base 310. This extended portion of the first board base 308 may include the board components 311 and 312 such that they are in a stacked orientation with each other, as well as the third board component 326 on the second board 304. While embodiments of the present disclosure describe the board assembly 300 including a first board 302, a second board 304, and a securing structure 306, one skilled in the art may appreciate that the baseboard 200 of FIG. 2A-2C may include a first board that includes the second baseboard connector receptacle 212 and the third baseboard connector receptacle 214 and a second board that is coupled to the first board by a floating coupling 336 and that includes the first baseboard connector receptacle 210 such that a portion of the baseboard 200 floats relative to a riser board 500 described in FIG. 5 or the board assembly 300 of FIG. 3A-3F and not depart from the scope of this disclosure.

Figure 4:
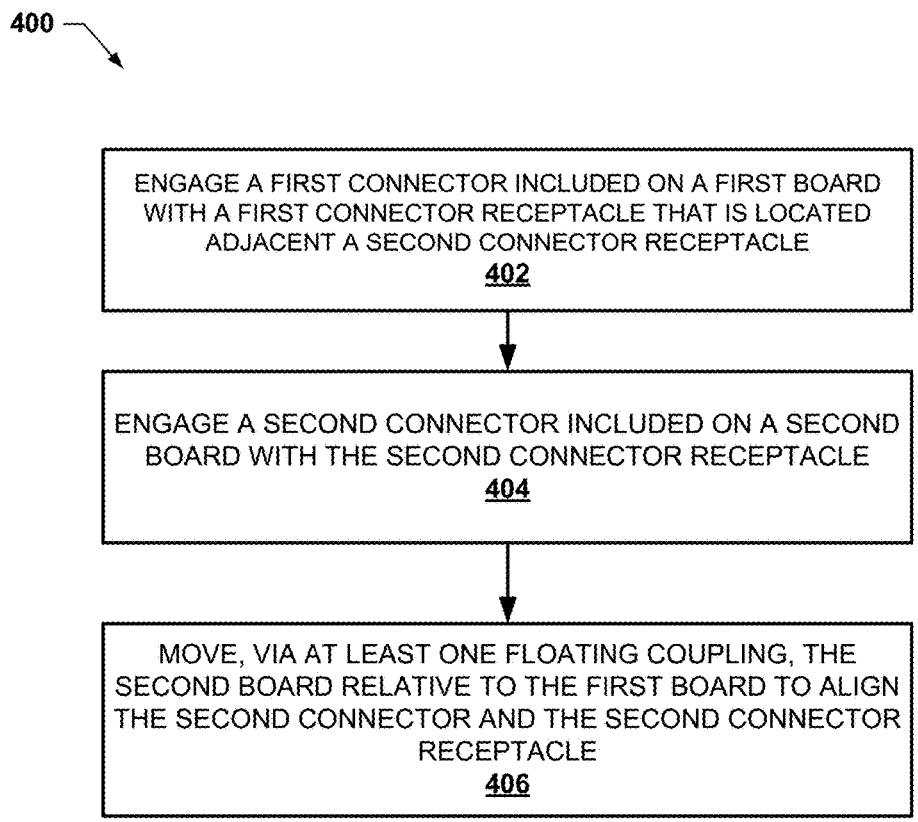
FIG. 4 is a flow chart illustrating an embodiment of a method for coupling a board assembly to a baseboard.
Figure 5A:
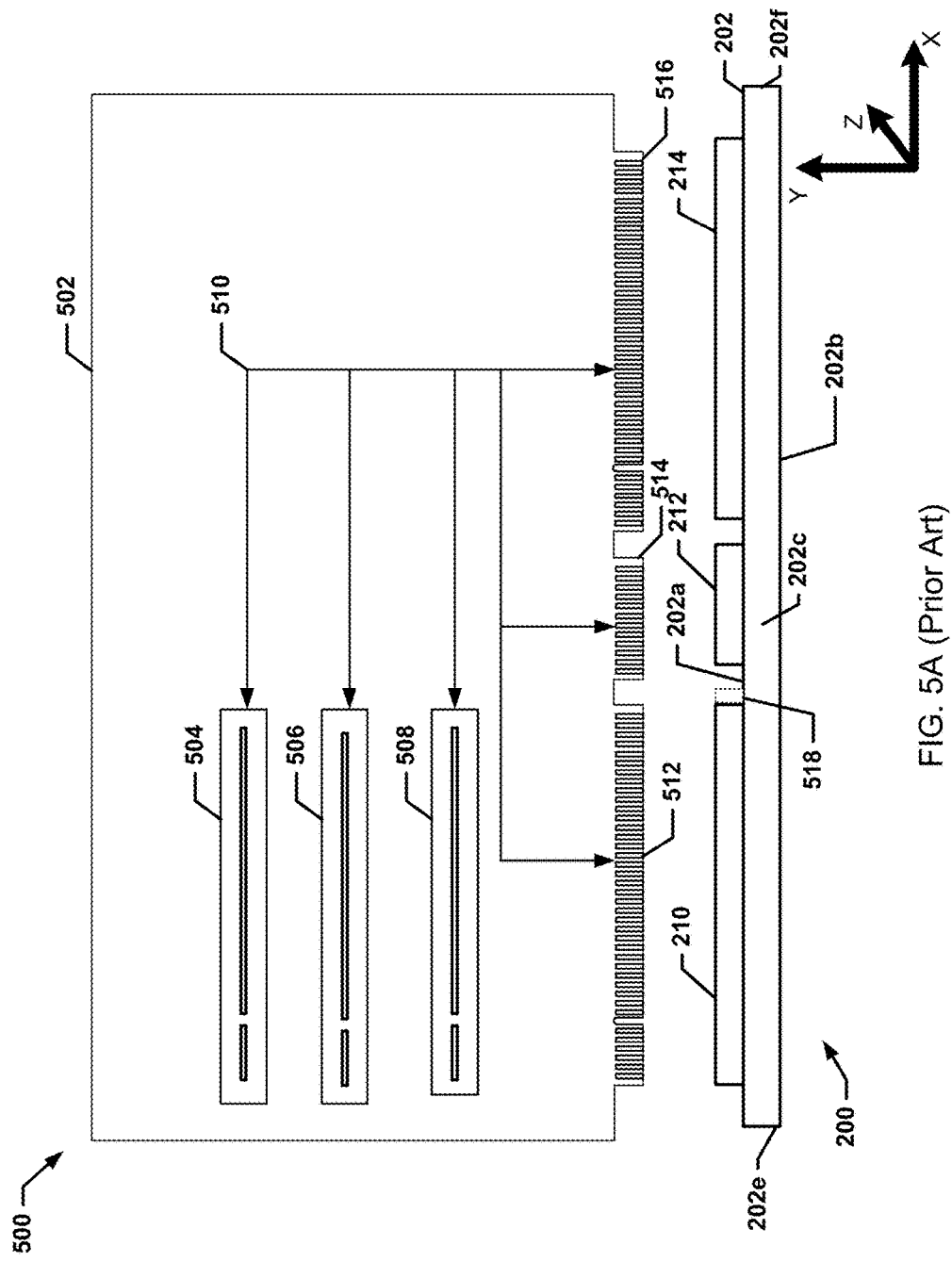
FIG. 5A is a front view illustrating the baseboard of FIGS. 2A-2C including a prior art board.
Figure 5B:
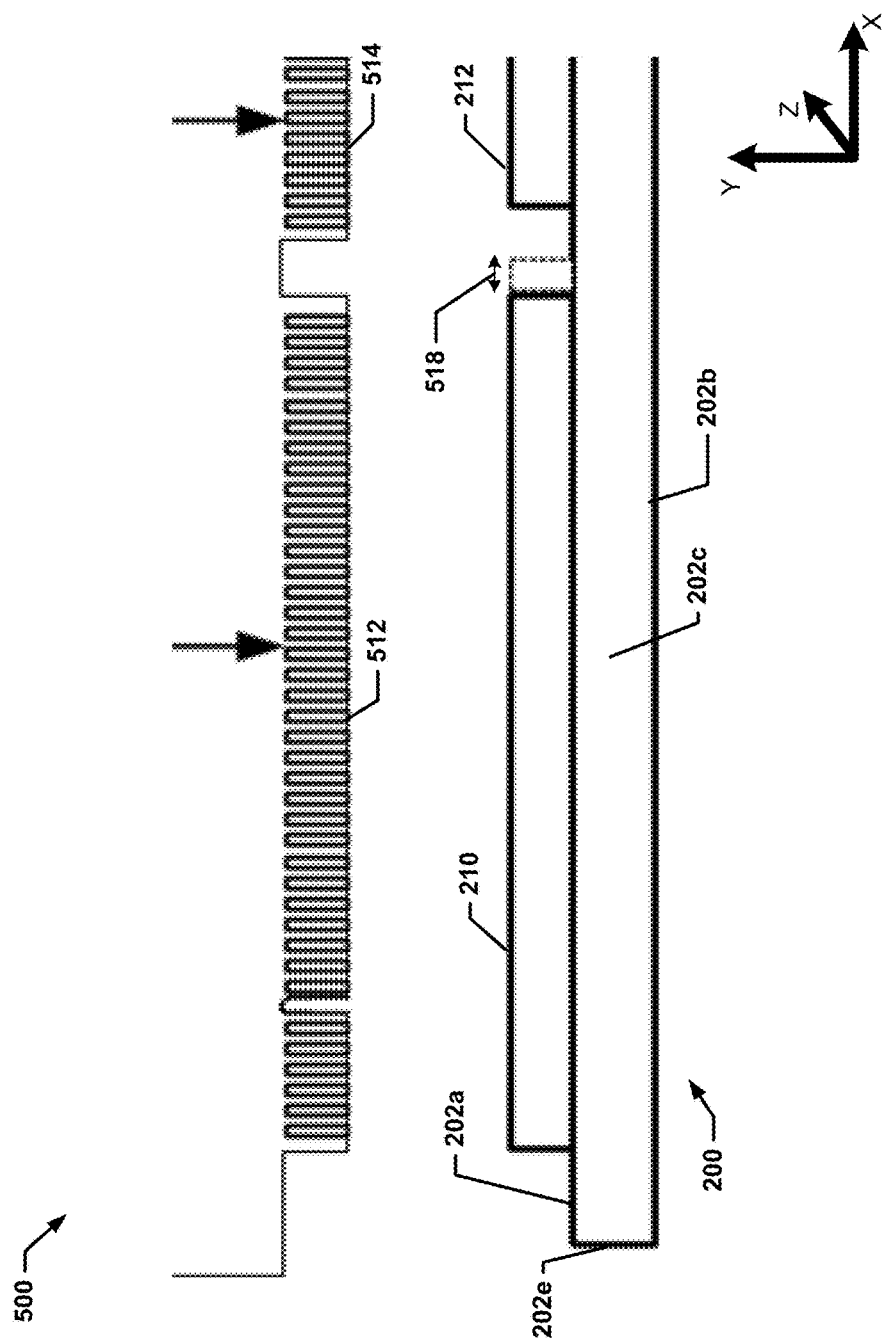
FIG. 5B is an exploded view of an offset on the baseboard illustrated in FIG. 5A.
Figure 6A:
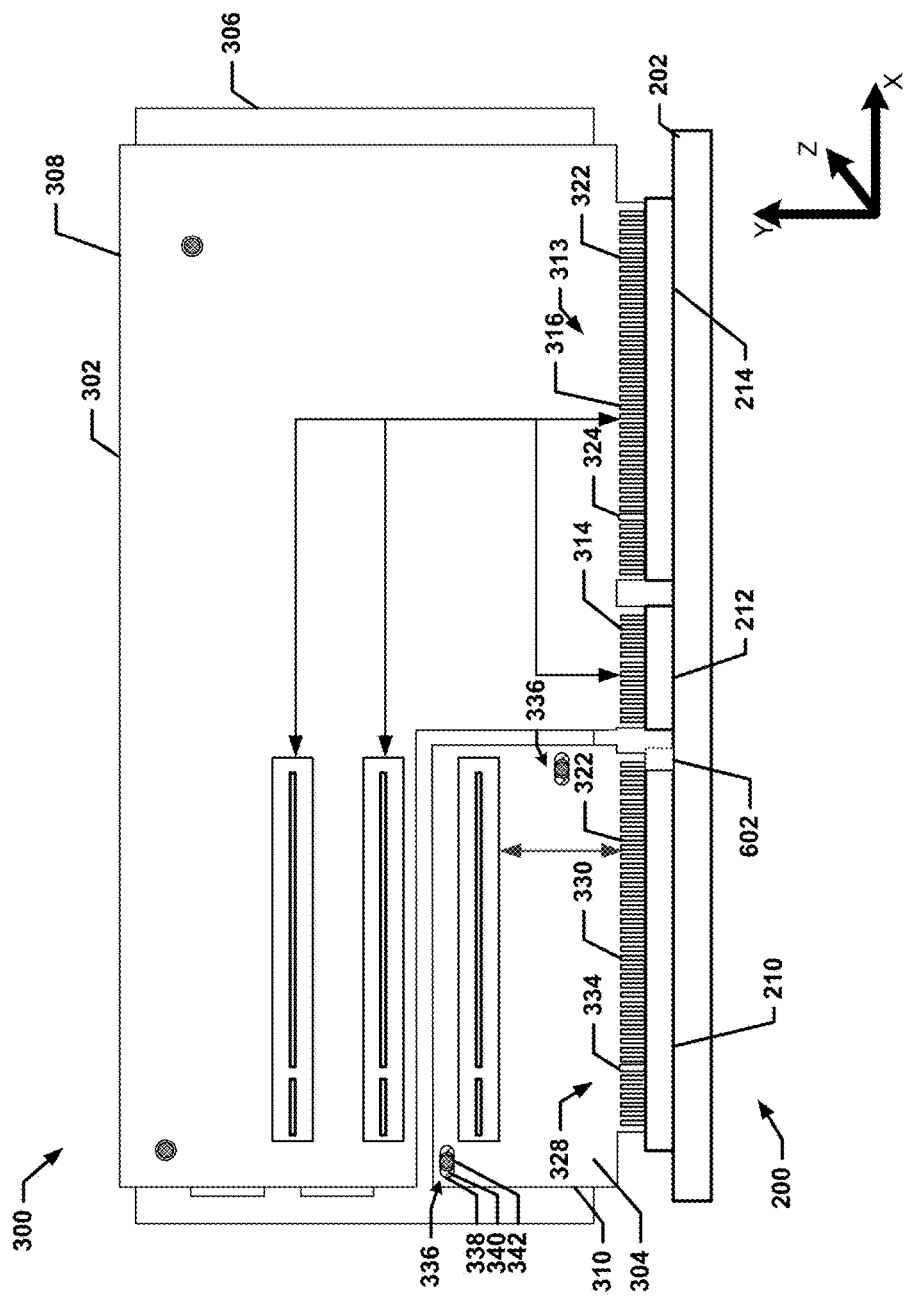
FIG. 6A is a front view illustrating an embodiment of a floating circuit board connector system that includes the baseboard of FIGS. 2A-2C prior to being coupled with the board assembly of FIGS. 3A-3C.
Figure 6B:
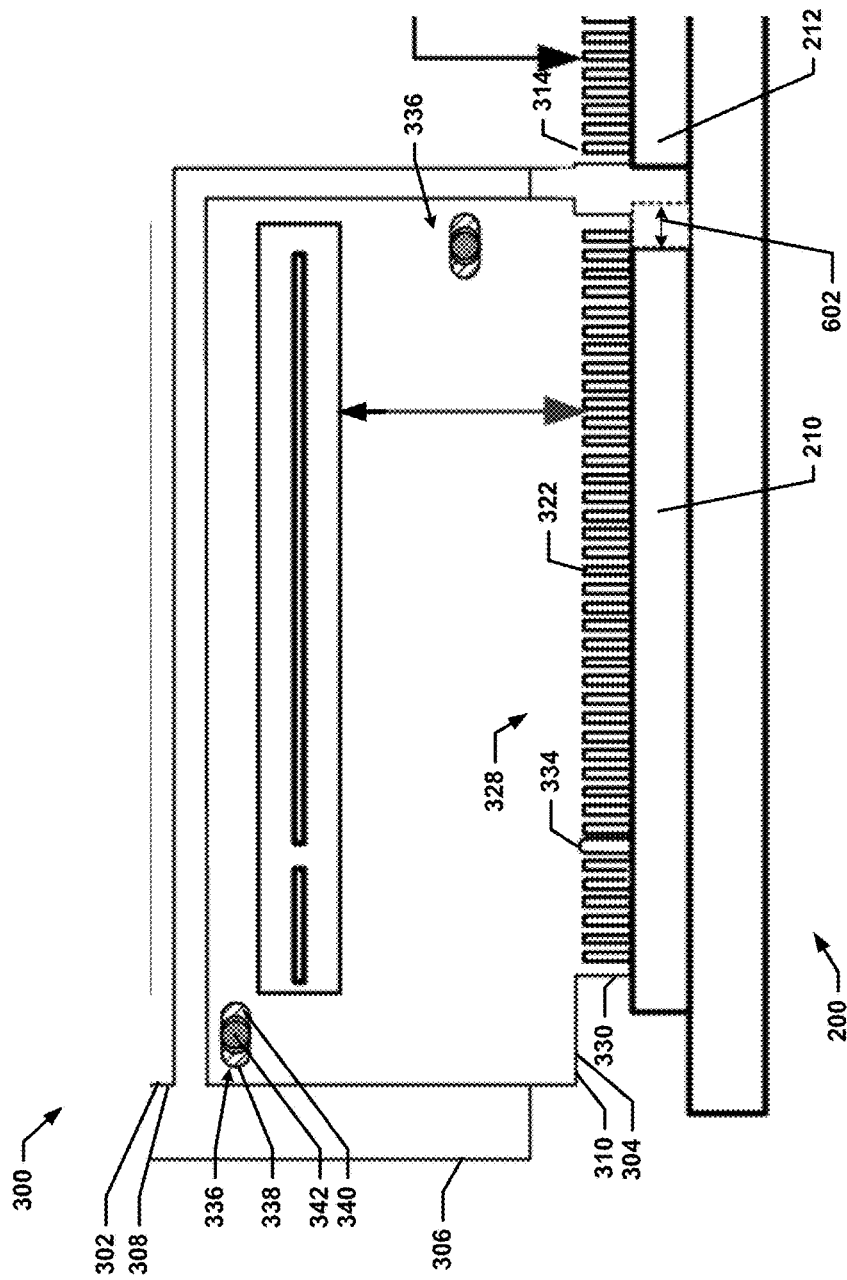
FIG. 6B is an exploded view of an offset on the baseboard illustrated in FIG. 6A.

Referring now to FIG. 4, an embodiment of a method 400 for coupling a board assembly to a baseboard is illustrated. As discussed below, the systems and methods of the present disclosure provide for the coupling of a board assembly to a baseboard that has out of tolerance spacing of connector receptacles using a floating coupling between a first board of the board assembly and a second board of the board assembly. Referring now to FIGS. 5A and 5B, a prior art PCI riser board 500 is illustrated. The PCI riser board 500 may include a base 502 that includes a plurality of PCI slots 504, 506, and 508 coupled to a plurality of edge connectors (e.g., a first edge connector 512, a second edge connector 514, and a third edge connector 516) via a bus 510. In some situations, the baseboard connector receptacles 210-214 of the baseboard 200 of FIG. 2 (i.e., which the edge connectors 512-516 on the PCI riser board 500 are to be inserted in) may include out-of-tolerance spacing (e.g., provided during the manufacturing of the baseboard 200.) For example, the second baseboard connector receptacle 212 and the third baseboard connector receptacle 214 may be spaced apart from the first baseboard connector receptacle 210 in the X-direction by an offset 518, which is greater than a spacing tolerance of the corresponding set of edge connectors 512-516, as such, when trying to connect the PCI riser board 500 to the baseboard 200, the offset may cause the edge connectors 512-516 to bind, cause damage to the edge connectors 512-516 or baseboard connector receptacles 210-214 (e.g., as a result of a user using excessive force to insert the edge connectors 512-516 into their respective misaligned baseboard connector receptacles), and/or cause the pins of the edge connectors 512-516 to be damaged, miss their respective pads, and/or short to adjacent pads. The systems and methods of the present disclosure provide a board assembly that includes a first board having a first connector and a second board having a second connector, with the first board and the second board coupled together by a floating coupling that allows the second board to move relative to the first board from a misaligned orientation into an aligned orientation when a spacing between the first baseboard connector receptacle and the second baseboard connector receptacle is different than a spacing of the first board connector and the second board connector. As such, the board assembly of the present disclosure eliminates the issues discussed above with respect to the prior art PCI riser board 500 while maintaining the benefits of a single board with multiple connectors. For example, the PCI riser board 500 may provide shared power, grounding and sideband signals to all the connector slots on the PCI riser board 500. Furthermore, the connector slots on the PCI riser board 500 are associated with a common chassis bay, and some cards that are coupled to the connector slots on the PCI riser board 500 may take up two slot locations. Thus, it is critical that the riser board connector slots have the same X-direction location and Y-direction pitch to meet PCI specifications of single or double wide card form factors. Thus, a single board assembly may better comply with chassis constraints of the system in which the board assembly is installed The method 400 begins at block 402 where a first connector included on a first board engages with a first connector receptacle that is located adjacent a second connector receptacle, and then proceeds to block 404 where a second connector included on a second board engages with the second connector receptacle. Referring to FIGS. 6A and 6B, an embodiment of the board assembly 300 of FIGS. 3A-3C engaging with the baseboard connector receptacles 210-214 of the baseboard 200 of FIGS. 2A-2C is illustrated. The first board 302 may include the first board connector system 313 having the first connector, which in the illustrated embodiment includes the first board connector 314 and the second board connector 316. The second board 304 may include the second board connector system 328 having the second board connector, which in the illustrated embodiment includes the third board connector 330. As illustrated, the board connectors 314 and 316 of the first board 302 engage the baseboard connector receptacles 212 and 214, respectively, while the board connector 330 of the second board 304 engages the baseboard connector receptacle 210. The board connectors 314, 316, and 330 may engage their respective baseboard connector receptacles 210-214 when in contact with their respective baseboard connector receptacles 210-214 such as, for example, when a user is attempting to insert the board connectors 314, 316 and 330 into their respective baseboard connector receptacles 210-214 when coupling the board assembly 300 to the baseboard 200.

As discussed previously, in some cases, the baseboard connector receptacles 210-214 may be manufactured to share a common longitudinal axis and may be spaced apart from each other along that common longitudinal axis such that the baseboard connector receptacles 210-214 may receive multiple board connectors located on a single board (as discussed in the example of the prior art in FIGS. 5A-5B above.) However, as discussed above, manufacturing imprecisions may cause the spacing between the baseboard connector receptacles 210-214 to be offset by an offset 602 (i.e., relative to the spacing of the board connectors 330, 314 and 316) that is greater than an allowed tolerance for the board connectors 330 and 314 when the board assembly 300 is at equilibrium (e.g., when no force is provided on the second board 304 that would otherwise move the second board 304 relative to the first board 302.) Thus, the board assembly 300 may be in a misaligned orientation when the spacing between the first baseboard connector receptacle 210 and the second baseboard connector receptacle 212 is different than a spacing of the board connector 330 and the board connector 314 (as indicated by the offset 602.) Furthermore, if the position of the board assembly 300 is adjusted such that the first board connector system 313 of the first board 302 is put into alignment with the baseboard connector receptacles 212 and 214, the board connector 330 of the second board 304 will then be misaligned with the baseboard connector receptacle 210.

Figure 7A:
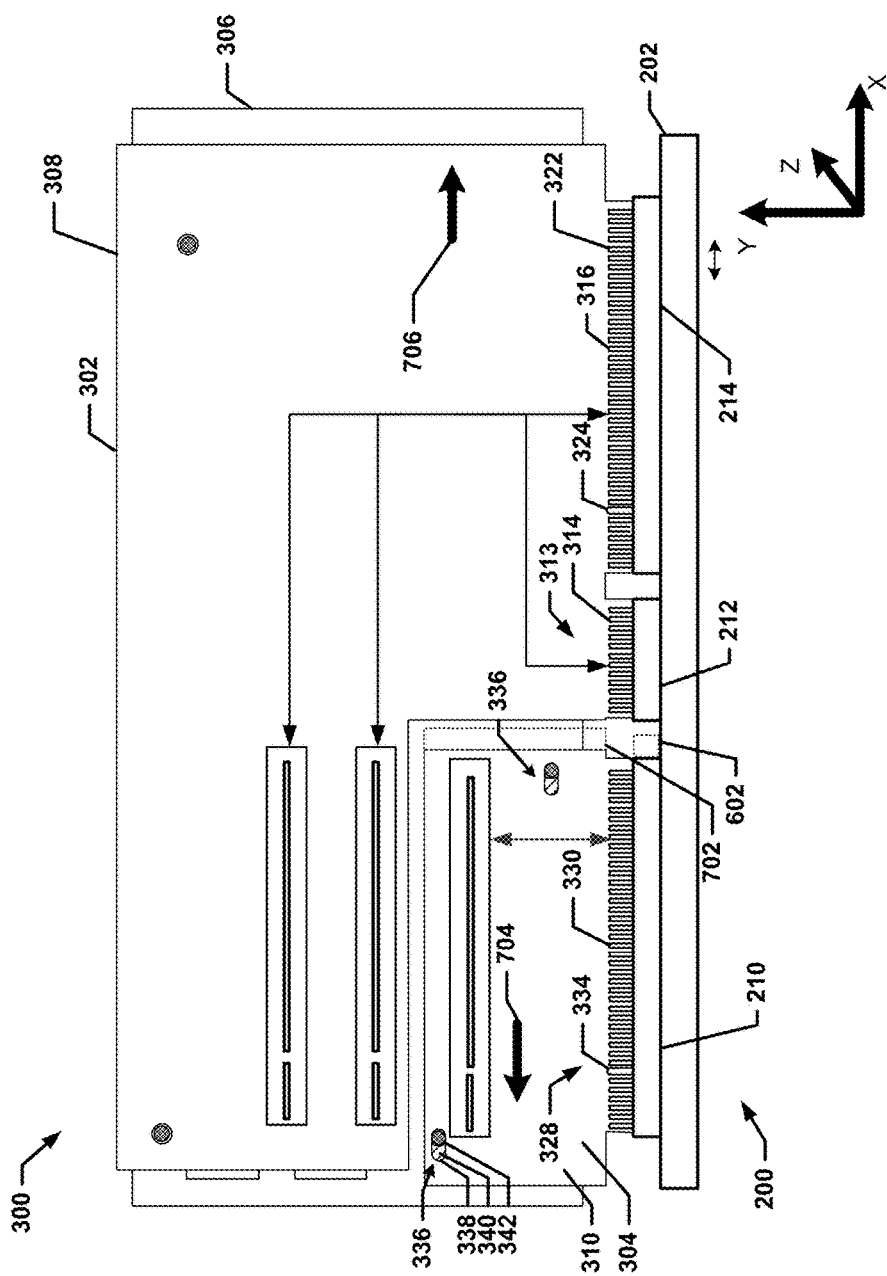
FIG. 7A is a front view of an embodiment of the floating circuit board connector system of FIG. 6A-6B illustrating an embodiment of the board assembly being aligned with the baseboard.
Figure 7B:
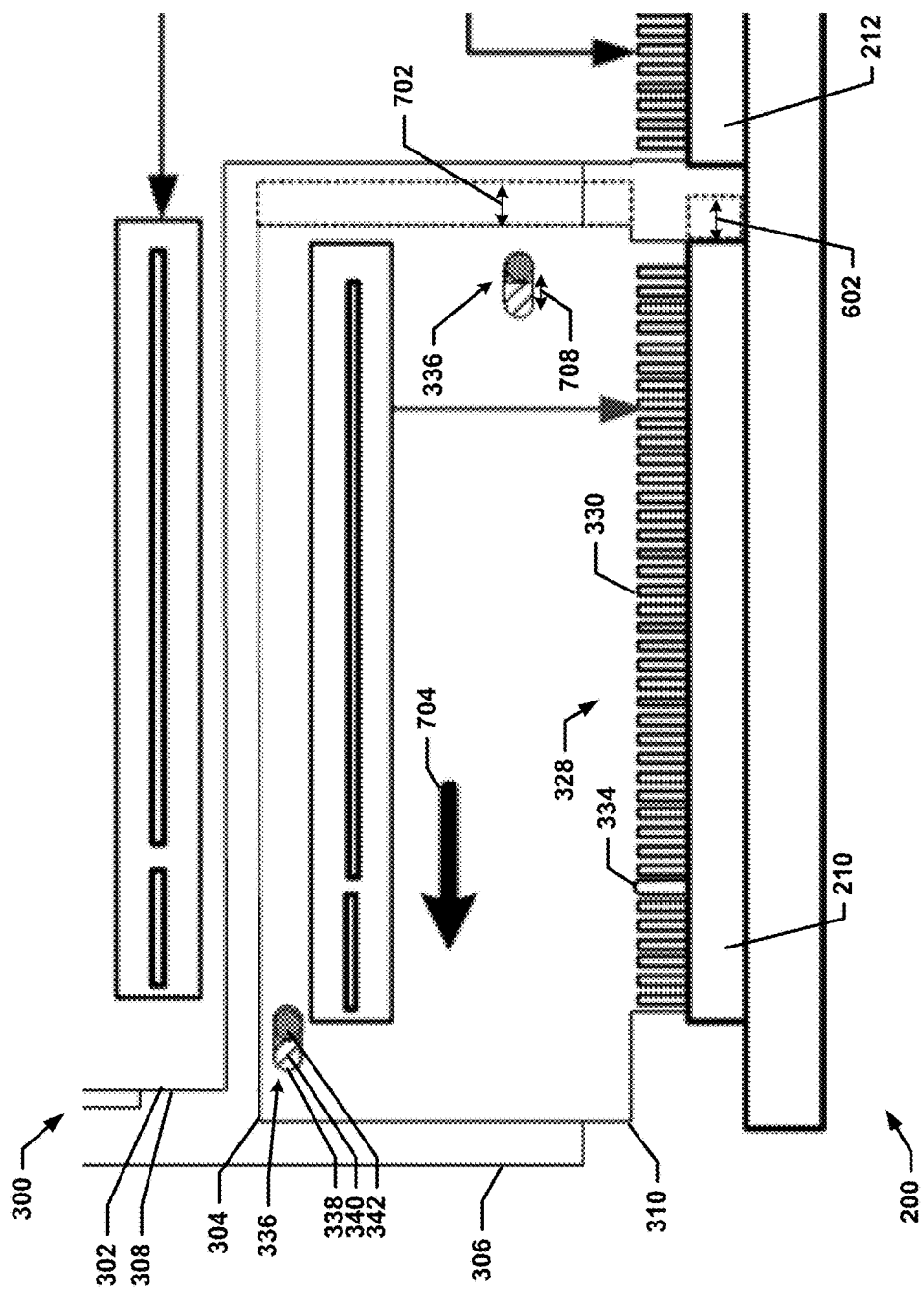
FIG. 7B is an exploded view of the offset of the baseboard and the alignment of the board assembly with the baseboard illustrated in FIG. 7A.

The method 400 then proceeds to block 406 where the second board moves, via at least one floating coupling, relative to the first board to align the second connector and the second connector receptacle. Referring to FIGS. 7A and 7B, in an embodiment, at block 406 the second board 304 may move, as indicated by arrow 704 and offset 702, from the misaligned orientation with the baseboard connector receptacle 210 to an aligned orientation with the baseboard connector receptacle 210. As can be seen in FIGS. 7A and 7B, the at least one floating coupling 336 allows for the movement of the second board 304 relative to the first board 302. In one example, a force (as indicated by arrow 704) may be applied to the second board 304 to move the second board 304 relative to the first board 302 in the direction indicated by arrow 704. In another example, the keying element 334 may receive the connector receptacle key 222, and a force (indicated by arrow 706) may be applied to the first board 302 such that an opposite force (indicated by arrow 704) is applied to the second board base 310 of the second board 304 (at the keying element 334) to cause the second board 304 to move relative to the first board 302. The resilient member 340 included in the slot 338 of the floating coupling 336 may provide an opposing force (e.g., opposite the force indicated by the arrow 704) such that the second board 304 returns to an equilibrium (e.g., centered) position that the second board 304 was at before the force was applied to the second board 304. The resilient member allows the board assembly 300 to start from a nominal location when being inserted into the baseboard 200 again. As illustrated, the resilient member 340 expanded a distance 708, which would substantially equal the offset 702.

Figure 8:
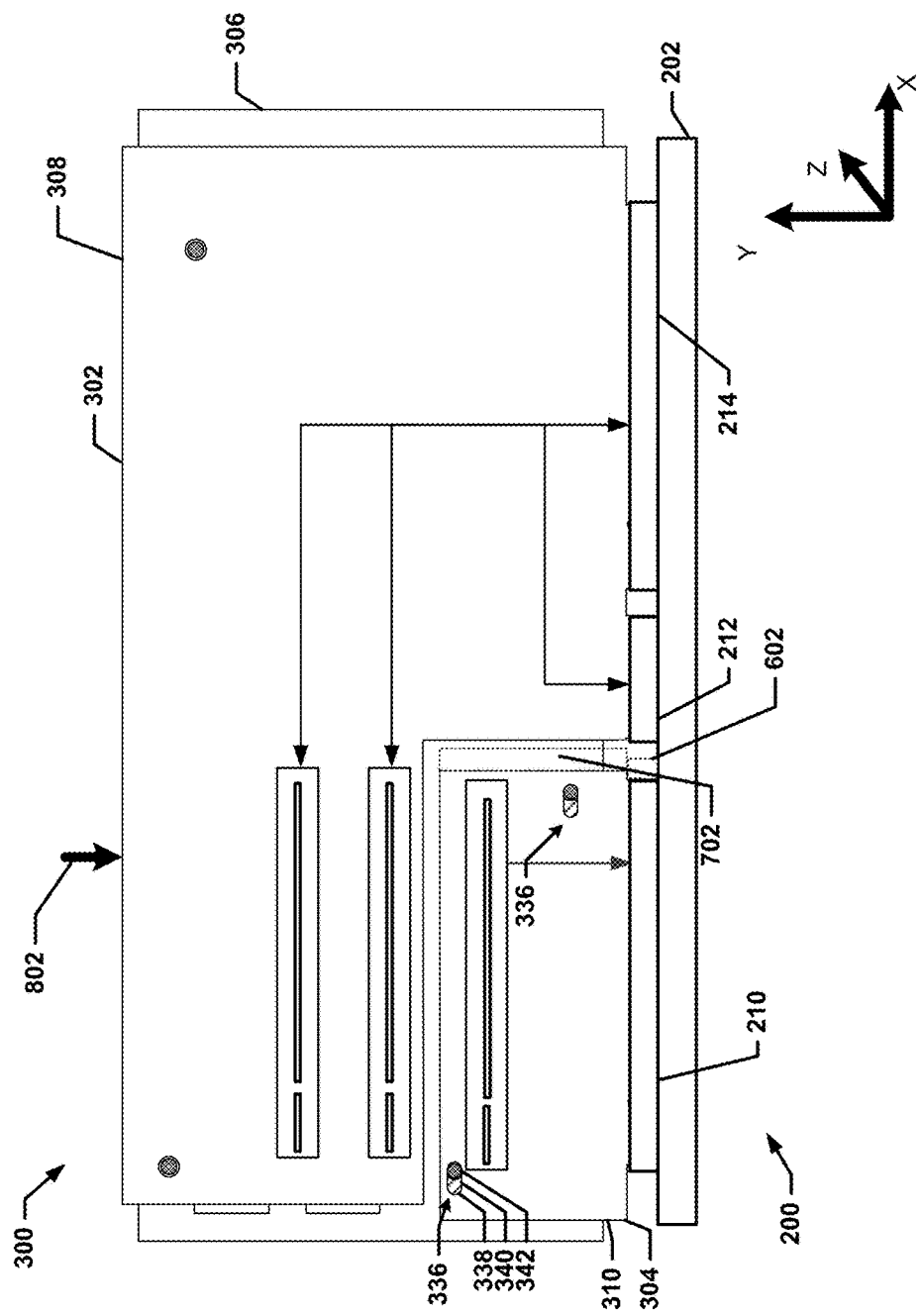
FIG. 8 is a front view of an embodiment of the floating circuit board connector system of FIG. 6A-6B illustrating an embodiment of the board assembly being coupled to the baseboard.

Referring to FIG. 8, once the first board 302 and the second board 304 are aligned with their respective baseboard connector receptacles 212-214 and 210, the board connectors 314, 316, and 330 may be inserted into the baseboard connector receptacles 212-214 and 210, respectively, as indicated by arrow 802. The electrical contacts 322 of the board connectors 314, 316, and 330 may couple with their respective electrical contacts (e.g., pads) of the baseboard connector receptacles 212-214 and 210 and provide electrical communication between the baseboard 200 and the boards 302 and 304. While the discussion above generally references forces provided on the first board 302 and the second board 304, the forces introducing the relative movement of the first board 302 and the second board 304 may be provided in a variety of manners. For example, the baseboard connector receptacles 212-214 and 210 may defined connector slots that include beveled edges that are configured to "catch" the connectors on the first board 302 and the second board 304 when those connectors are out of alignment, and then channel those connectors (i.e., via the relative movement of the first board 302 and the second board 304) into the baseboard connector receptacles 212-214 and 210 to provide electrical contacts discussed above.

Thus, systems and methods have been described that provide for connection of a board assembly having multiple board connectors to a baseboard. Using the systems and methods of the present disclosure, multiple board connectors of a board assembly may be inserted into respective connector receptacles when the spacing of those connector receptacles is different than the spacing of the multiple board connectors. By including a first board coupled to a second board by a floating coupling, the second board may be moved relative to the first board such that the second board may move from a misaligned orientation with its connector receptacle to an aligned orientation with its connector receptacle. As such, the board assembly of the present disclosure prevents binding between the board connectors with the connector receptacles, damage to the connector receptacles, damage to the pins of the board connectors, shorting of pins on the board connectors to adjacent pads of the connector receptacles, and/or pins of the board connectors missing their respective pads, as is common in traditional connector systems that utilize multiple connectors on a board.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A board assembly, comprising:
   a first board including:
      a first board connector that is configured to connect to a first baseboard connector receptacle included on a baseboard; and
      a first board component coupled to the first board connector through the first board; and
   a second board that is movably coupled to the first board by at least one floating coupling that allows the second board to move relative to the first board, wherein the first board and the second board substantially share a common longitudinal axis, and wherein the second board includes:
      a second board connector that is configured to connect to a second baseboard connector receptacle included on the baseboard; and
      a second board component coupled to the second board connector through the second board.

2. The board assembly of claim 1, wherein the at least one floating coupling is configured to allow the second board to move from a misaligned orientation into an aligned orientation when a spacing between the first baseboard connector receptacle and the second baseboard connector receptacle is different than a spacing of the first board connector and the second board connector.

3. The board assembly of claim 1, wherein the at least one floating coupling includes:
   a first slot defined by the second board; and
   at least one resilient member that is located in the first slot and that engages a coupling member that is coupled to the first board, wherein the resilient member is configured to resist movement of the second board relative to the first board.

4. The board assembly of claim 1, wherein the second board connector includes a keying element that is configured to receive a connector receptacle key on the second baseboard connector receptacle to align the second board connector with the second baseboard connector receptacle when a spacing between the first baseboard connector receptacle and the second baseboard connector receptacle is different than a spacing of the first board connector and the second board connector.

5. The board assembly of claim 1, wherein the floating coupling allows the second board to move relative to the first board in a direction that is substantially parallel with the baseboard.

6. The board assembly of claim 1, further comprising:
   a mounting structure, wherein the first board is coupled to the mounting structure, and wherein the second board is moveably coupled to the mounting structure via the at least one floating coupling.

7. The board assembly of claim 6, wherein the first board is coupled to the mounting structure by a first floating coupling that allows the first board to move relative to the mounting structure, and wherein the second board is coupled to the mounting structure by a second floating coupling that allows the second board to move relatively to the mounting structure.

8. An Information Handling System (IHS), comprising:
   a chassis;
   a first board connector receptacle located in the chassis;
   a second board connector receptacle located in the chassis, wherein the first board connector receptacle and the second board connector receptacle substantially share a common longitudinal axis; and
   a board assembly; wherein the board assembly comprises:
      a first board having a first board connector configured to be coupled with the first board connector receptacle; and
      a second board that is movably coupled to the first board by at least one floating coupling that allows the second board to move relative to the first board, wherein the second board includes a second board connector configured to be coupled with the second board connector receptacle.

9. The IHS of claim 8, wherein the at least one floating coupling is configured to allow the second board to move from a misaligned orientation into an aligned orientation when a spacing between the first board connector receptacle and the second board connector receptacle is different than a spacing of the first board connector and the second board connector.

10. The IHS of claim 8, wherein the at least one floating coupling includes:
    a first slot defined by the second board; and
    at least one resilient member that is located in the first slot and that engages a coupling member that is coupled to the first board, wherein the resilient member is configured to resist movement of the second board relative to the first board.

11. The IHS of claim 8, wherein the second board connector includes a keying element that is configured to receive a connector receptacle key on the second board connector receptacle to align the second board connector with the second board connector receptacle when a spacing between the first board connector receptacle and the second board connector receptacle is different than a spacing of the first board connector and the second board connector.

12. The IHS of claim 8, wherein the floating coupling allows the second board to move relative to the first board in a direction that is substantially parallel with the first board connector receptacle and the second board connector receptacle.

13. The IHS of claim 8, further comprising:
a mounting structure, wherein the first board is coupled to the mounting structure, and wherein the second board is moveably coupled to the mounting structure via the at least one floating coupling.

14. The IHS of claim 13, wherein the first board is coupled to the mounting structure by a first floating coupling that allows the first board to move relative to the mounting structure, and wherein the second board is coupled to the mounting structure by a second floating coupling that allows the second board to move relatively to the mounting structure.

15. A method of coupling a board assembly to a baseboard, comprising:
engaging a first connector included on a first board with a first connector receptacle that is located adjacent a second connector receptacle;
engaging a second connector included on a second board, with the second connector receptacle, wherein the second board is movably coupled to the first board by at least one floating coupling; and
moving, via the at least one floating coupling, the second board relative to the first board to align the second connector and the second connector receptacle when a spacing between the first connector receptacle and the second connector receptacle is different than a spacing of the first connector and the second connector.

16. The method of claim 15, wherein the moving, via the at least one floating coupling, the second board relative to the first board to align the second connector and the second connector receptacle when a spacing between the first connector receptacle and the second connector receptacle is different than a spacing of the first connector and the second connector includes:
moving, via the at least one floating coupling, the second board from a misaligned orientation into an aligned orientation.

17. The method of claim 15, wherein the moving, via the at least one floating coupling, the second board relative to the first board to align the second connector and the second connector receptacle when a spacing between the first connector receptacle and the second connector receptacle is different than a spacing of the first connector and the second connector includes:
receiving, by a keying element included in the second connector, a connector receptacle key on the second connector receptacle to align the second connector with the second connector receptacle.

18. The method of claim 15, wherein the moving, via the at least one floating coupling, the second board relative to the first board to align the second connector and the second connector receptacle when a spacing between the first connector receptacle and the second connector receptacle is different than a spacing of the first connector and the second connector includes:
moving, via the floating coupling, the second board relative to the first board in a direction that is substantially parallel with the baseboard.

19. The method of claim 15, further comprising:
engaging, by at least one resilient member that is located in a first slot included in the second board, a coupling member that is coupled to the first board; and
resisting, by the at least one resilient member, movement of the second board relative to the first board.

20. The method of claim 15, wherein the first board is coupled to a mounting structure, and wherein the second board is moveably coupled to the mounting structure via the at least one floating coupling.

\* \* \* \* \*